(12) United States Patent
Kaskoun et al.

(10) Patent No.: US 7,939,926 B2
(45) Date of Patent: May 10, 2011

(54) VIA FIRST PLUS VIA LAST TECHNIQUE FOR IC INTERCONNECTS

(75) Inventors: Kenneth Kaskoun, La Jolla, CA (US); Shiqun Gu, San Diego, CA (US); Bart Swinnen, Holsbeek (BE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/334,433

(22) Filed: Dec. 12, 2008

(65) Prior Publication Data
US 2010/0148371 A1    Jun. 17, 2010

(51) Int. Cl.
*H01L 23/02* (2006.01)
(52) U.S. Cl. ........................ 257/686; 257/777
(58) Field of Classification Search .................. 257/686, 257/777, 723, 724
See application file for complete search history.

(56) References Cited

U.S. PATENT DOCUMENTS

| | | | | |
|---|---|---|---|---|
| 3,577,037 | A * | 5/1971 | Di Pietro et al. | 257/621 |
| 3,648,131 | A * | 3/1972 | Stuby | 257/622 |
| 4,074,342 | A * | 2/1978 | Honn et al. | 361/404 |
| 6,400,008 | B1 * | 6/2002 | Farnworth | 257/698 |
| 6,599,778 | B2 | 7/2003 | Pogge et al. | |
| 7,354,798 | B2 | 4/2008 | Pogge et al. | |
| 7,638,869 | B2 * | 12/2009 | Irsigler et al. | 257/686 |
| 2003/0111733 | A1 | 6/2003 | Pogge | |
| 2006/0121690 | A1 | 6/2006 | Pogge | |
| 2008/0073752 | A1 | 3/2008 | Asai | |
| 2008/0157361 | A1 | 7/2008 | Wood et al. | |
| 2008/0258259 | A1 * | 10/2008 | Osaka et al. | 257/532 |
| 2010/0181589 | A1 | 7/2010 | Huang et al. | |

FOREIGN PATENT DOCUMENTS

| | | |
|---|---|---|
| EP | 2133909 | 12/2009 |
| WO | 2008035261 | 3/2008 |
| WO | 2008120418 | 9/2008 |

OTHER PUBLICATIONS

International Search Report-PCT/ US2009/067682, International Search Authority-European Patent Office May 11, 2010.
Written Opinion-PCT/ US2009/067682, International Search Authority-European Patent Office May 11, 2010.
Kommera S et al: "Novel through-die connections for MEMS applications" XP9022355, Database accession No. 7764513, Database Inspec [Online], The Institution of Electrical Engineers, Stevenage, GB; 2003, & Micromachining and Microfabrication Process Technology VII Jan. 27-29, 2003 San Jose, CA, USA, vol. 4979, 2003, pp. 261-270, Proceedings of the SPIE—The International Society for Optical Engineering SPIE-Int. Soc. Opt. Eng USA, LNKD-doi:10.1117/12.472804, ISSN: 0277-786X.

* cited by examiner

*Primary Examiner* — S. V Clark
(74) *Attorney, Agent, or Firm* — Michelle Gallardo; Sam Talpalatsky; Jonathan T. Velasco

(57) ABSTRACT

A multi-tiered IC device contains a first die including a substrate with a first and second set of vias. The first set of vias extends from one side of the substrate, and the second set of vias extend from an opposite side of the substrate. Both sets of vias are coupled together. The first set of vias are physically smaller than the second set of vias. The first set of vias are produced prior to circuitry on the die, and the second set of vias are produced after circuitry on the die. A second die having a set of interconnects is stacked relative to the first die in which the interconnects couple to the first set of vias.

12 Claims, 3 Drawing Sheets

VIA FIRST PLUS VIA LAST TECHNIQUE FOR IC INTERCONNECTS

TECHNICAL FIELD

This disclosure generally relates to integrated circuits (ICs). More specifically, this disclosure relates to multi-tiered IC devices and even more specifically to designs and methods for interconnecting dies.

BACKGROUND

IC technology is continuously driven by a demand for higher performance chips. One limiting factor is timing delays resulting from long interconnects in 2-D structures. As a result, IC technology is progressing towards multi-tiered (3-D) IC devices (also referred to as multi-layered IC devices or stacked IC devices). In multi-tiered IC devices short vertical interconnects (also known as through-silicon vias or TSVs) replace problematic longer horizontal interconnects in 2-D structures. Two methods for creating the TSVs are via first and via last.

The via first method involves forming the TSVs in a substrate before any other fabrication of circuitry occurs. A pattern of vias is etched or drilled into a fraction of the depth of the base substrate. The vias are then filled with an insulating layer and conducting material, and circuit fabrication follows. One or more dies can then bond to the TSVs. The back side of the substrate containing the TSVs is ground down to expose the TSVs. Metallization of the exposed TSVs enables packaging of the multi-tiered structure.

In the via last method, circuitry fabrication takes place before the TSVs are formed. The circuitry contains interconnect pads that will be coupling points for the TSVs. TSVs are created by either etching or drilling into the pad through the depth of the substrate or etching or drilling from the back side of the substrate to the pad. The TSV is then filled with an insulating barrier and conducting material. The back of the substrate is metallized to enable packaging of the multi-tiered structure.

Both techniques enable building of multi-tiered structures and have specific advantages. However, each technique has undesired limitations. The via first method utilizes semiconductor fabrication processes, allowing for small vias and a resulting high packing density (ratio of surface area containing vias to the total surface area). This via first process fabricates vias having a limited aspect ratio (ratio of depth of TSV to diameter of TSV) which limits the depth of the TSV to less than the thickness of the substrate. As a result, grinding the substrate to expose the TSV reduces the substrate thickness and leads to unpredictable responses from circuitry built on the substrate. The via last method utilizes processes for forming the TSV that result in larger diameters and lower density of TSVs. The larger diameters allow the depth of the TSV to extend the entire thickness of the substrate.

It would be preferable in some situations to have TSVs of high packing density (as in the via first method) that also extend the entire depth of the substrate (as in the via last method).

BRIEF SUMMARY

In accordance with one aspect of the disclosure, a multi-tiered IC device has a first die including a substrate with a first side and second side opposite the first side. A first set of vias extend into the substrate from the first side. A second set of vias extend into the substrate from the second side. The second set of vias are coupled to the first set of vias. The physical size of vias in the first set of vias are smaller than the vias in the second set of vias. Vias in the first set of vias are produced before any other processing of the IC. Vias in the second set of vias are produced after other processing of the IC. A second die having a set of interconnects is stacked relative to the first die so that the interconnects couple to the first set of vias.

In accordance with another aspect of the disclosure, a process for manufacturing a multi-tiered integrated circuit includes providing a first die including a substrate with a first side and a second side facing away from the first side. The process includes stacking a second die having a plurality of interconnects relative to the first die. The process also includes manufacturing a first set of vias extending from the first side of the first die prior to producing circuitry on the first die. The process also includes manufacturing a second set of vias extending from the second side of the first die after producing circuitry on the first die in which at least one of the vias of the first set communicates with at least one of the vias of the second set. Furthermore, at least one of the vias of the first set communicates with at least one of the interconnects such that at least one of the vias of the second set communicates with at least one of the interconnects.

This has outlined, rather broadly, the features and technical advantages of the present invention in order that the detailed description that follows may be better understood. Additional features and advantages of the invention will be described below. It should be appreciated by those skilled in the art that this disclosure may be readily utilized as a basis for modifying or designing other structures for carrying out the same purposes of the present invention. It should also be realized by those skilled in the art that such equivalent constructions do not depart from the teachings of the invention as set forth in the appended claims. The novel features, which are believed to be characteristic of the invention, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosure in the present application, reference is now made to the following descriptions taken in conjunction with the accompanying drawings, in which.

DETAILED DESCRIPTION

Figure 1:
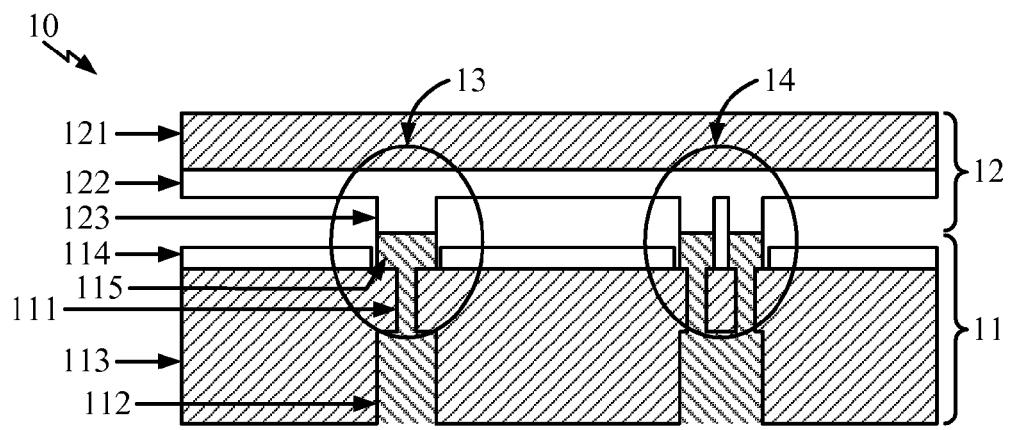
FIG. 1 is a schematic drawing of a multi-tiered IC device having two sets of vias, one of which is manufactured by via first, and the other is manufactured by via last.

FIG. 1 is a schematic drawing of a multi-tiered IC device 10 having a first die 11 and a second die 12. The first die 11 includes a substrate layer 113 and a circuitry layer 114. The substrate layer 113 includes a first set of vias 111 and a second set of vias 112. The first set of vias 111 are coupled to the second set of vias 112. The first set of vias 111 are also coupled to interconnects 115. The second die 12 includes a substrate layer 121 and a circuitry layer 122 coupled to interconnects 123. The interconnects 123 couple to the first set of vias 111. For illustrative purposes, the location 13 contains a single via from the first set of vias 111 coupled to a single via from the second set of vias 112. An alternate embodiment is illustrated in the location 14 where multiple vias from the first set of vias 111 couple to a single via from the second set of vias 112.

In one embodiment, multiple vias in the first set of vias 111 are coupled to a single via in the second set of vias 112 (as illustrated in the location 14) when multiple vias of the first set carry the same signal. For example, the first set of vias 111 may carry supply voltage for the circuitry layer 122 on the second die 12.

In another embodiment, a single via in the first set of vias 111 is coupled to a single via in the second set of vias 112 (as illustrated in the location 13) when vias in the first set of vias 111 carry independent signals.

The first set of vias 111 are produced through via first processing and in one embodiment have diameters between 0.1-10 microns. The second set of vias 112 are produced through via last processing and in one embodiment have diameters between 11-100 microns.

Although FIG. 1 and the above description only discuss two dies coupled together, one skilled in the art will recognize that additional dies may be further stacked on the multi-tiered integrated circuit device to form a larger structure. A variable number of dies may be stacked by continuing to form TSVs through the dies.

FIGS. 2 through 6 show an exemplary method of manufacturing a multi-tiered IC device having two sets of vias, one of which is manufactured by the via first process, and the second is manufactured by the via last process.

Figure 2:
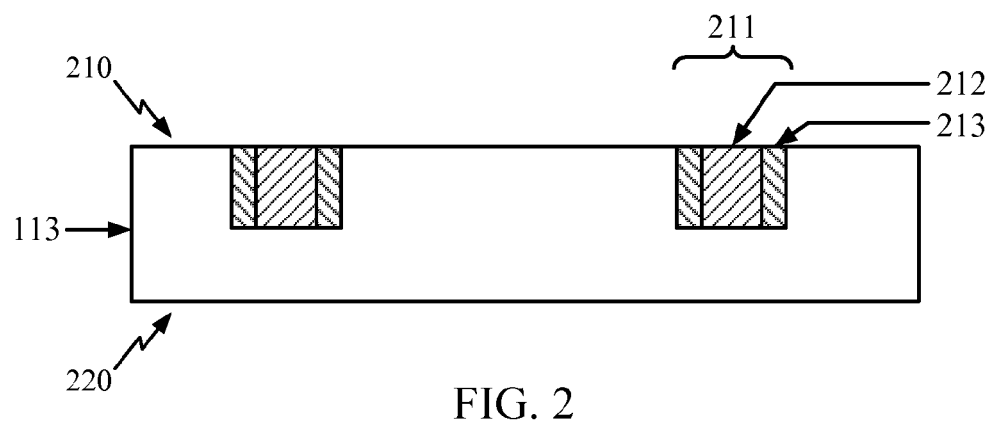
FIG. 2 is a schematic drawing of the first die after the first set of vias are manufactured.

FIG. 2 shows the substrate layer 113 having a front side 210 and a back side 220. A first set of vias 211 have been formed on the front side 210. The first set of vias 211 includes a conducting material 212 and an insulating material 213. The insulating material 213 electrically isolates vias in the second set of vias 221 from the substrate 113. In one embodiment, the first set of vias 211 have diameters ranging between 1-10 microns.

Figure 3:
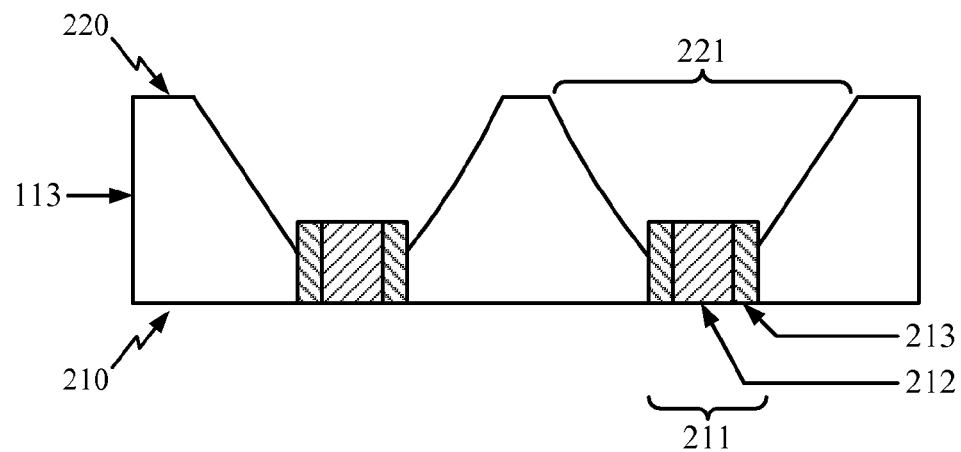
FIG. 3 is a schematic drawing of the first die after the second set of vias are manufactured.

FIG. 3 shows the substrate layer 113 with the first set of vias 211 on the front side 210. For illustrative purposes, the substrate layer 113 has been rotated 180 degrees. After active circuitry (not shown) has been fabricated, the second set of vias 221 are manufactured. In the depicted embodiment, the second set of vias have tapering walls. The tapering facilitates processes discussed below, namely electrical isolation of the second set of vias 221 from the substrate 113. In one embodiment, the second set of vias 221 have diameters ranging between 50-100 microns. The tapered walls of the second set of vias 221 can be achieved by dry or wet etch.

Tapering the walls of the second set of vias 221 facilitates the next process involving electrically isolating the second set of vias 221 from the substrate layer 113 while coupling the second set of vias 221 with the first set of vias 211. Depositing conformal coatings on non-tapered walls is a difficult process because the wall is shadowed from a conventional deposition source. Additionally, the insulating layer that deposits on the exposed first set of vias 211 must be etched away without completely etching the deposited insulator on the walls of the second set of vias 221. Tapering the walls of the via facilitates the electrical isolation of the second set of vias 221 from the substrate layer 113 and facilitates the electrical coupling of the second set of vias 221 to the first set of vias 211.

Figure 4:
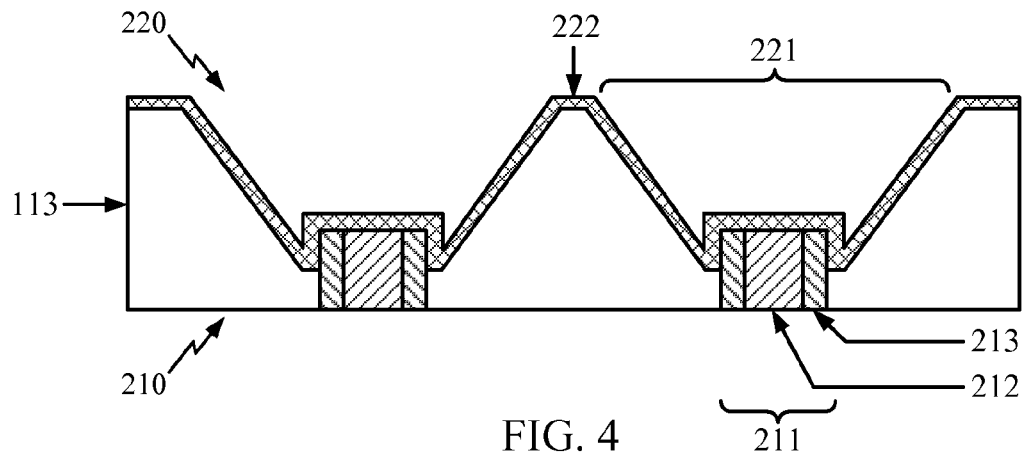
FIG. 4 is a schematic drawing of the first die after a conformal insulator layer is deposited.

FIG. 4 shows the substrate layer 113 with the first set of vias 211 and the second set of vias 221. Conformal deposition creates an insulator layer 222. The insulation layer 222 covers all areas with equal thickness on the backside 220 of the substrate 113. One technique for producing a conformal coating of the insulator layer 222 is physical vapor deposition (PVD).

As described earlier, tapering of the walls of the second set of vias 221 facilitates the coupling of the first set of vias 211 to the second set of vias 221. This is done by completely removing the insulating layer 222 from the first set of vias 211 without completely removing the insulating layer 222 from the walls of the second set of vias 221. In one embodiment, etching is used to remove the insulating layer 222.

Figure 5:
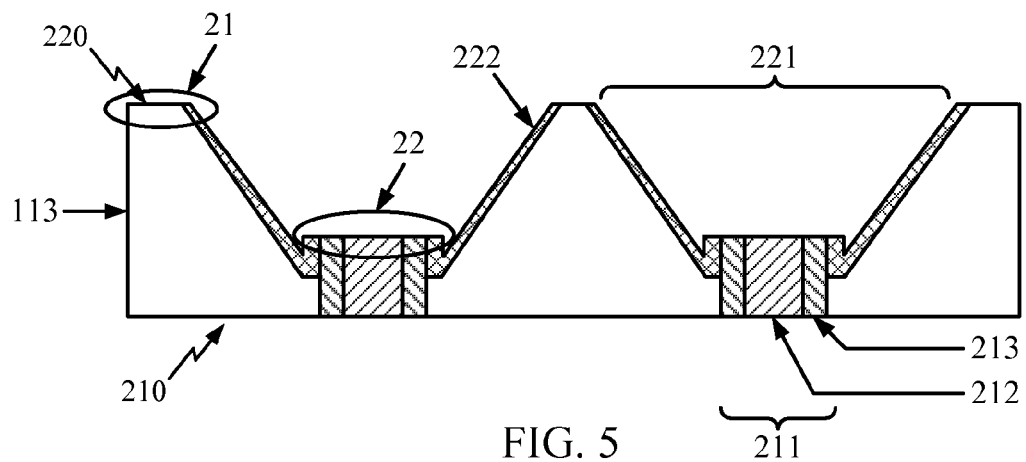
FIG. 5 is a schematic drawing after the insulating layer is etched to expose contact points for the first set of vias to the second set of vias.

FIG. 5 shows the substrate layer 113 with the first set of vias 211 and the second set of vias 221. In one embodiment, etching with reactive ion etching exposes different thicknesses for the tapered regions and non-tapered regions of the insulator layer 222 to impinging ions with a trajectory orthogonal to the substrate layer 113. The thickness of the insulator 222 on the tapered walls of the second set of vias 221 seen by impinging ions is the deposition thickness increased by a factor of the cosine of the angle of tapering. Complete etching of the insulator layer 222 from non-tapered regions in the backside of the substrate 220 and a substantially parallel side of the first vias is illustrated in the locations 21 and 22, respectively. Etching also thins the insulator layer 222 in tapered regions of the second set of vias 221. The location 22 illustrates a coupling point for the first set of vias 211 to the second set of vias 221. Remaining areas of the insulating layer 222 electrically isolate the second set of vias 221 from the substrate 113.

Figure 6:
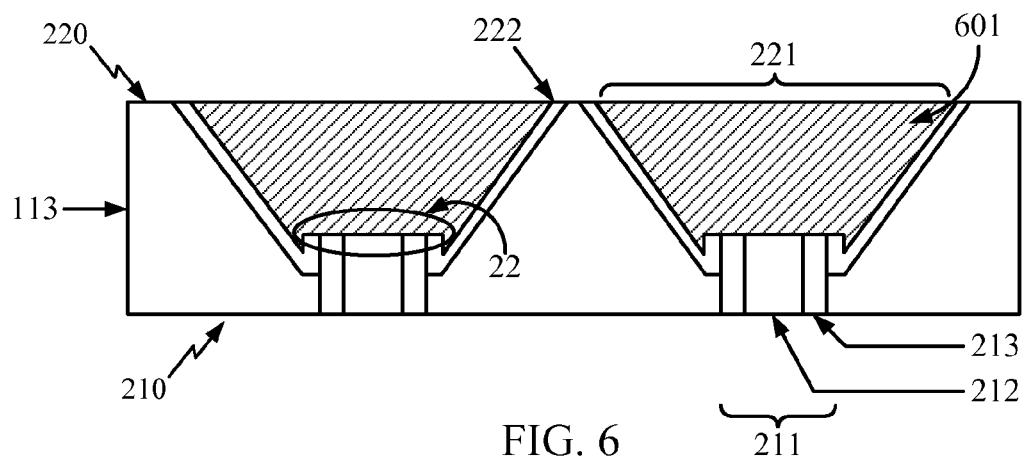
FIG. 6 is a schematic drawing after the conducting material is deposited in the second set of vias.

FIG. 6 shows a conducting material 601 deposited in the second set of vias 221. The conducting material may be, for example, copper or carbon nanotubes or a combination of the copper and carbon nanotubes. The location 22 illustrates coupling between the first set of vias 211 and the second set of vias 221.

One advantage of this disclosure is the ability to have low packing density of vias on one side of the die coupling to a high packing density of interconnects on the other side of the die. Memory devices conventionally use a high packing density of interconnects with respect to microprocessors. However, massive parallelization of the interconnects on memory devices can be accomplished because many of the interconnects share common signals, i.e. ground and supply voltage. As a result, not all of the interconnects require an individual connection to the outside world. Therefore, a high density of interconnects on a die can be accommodated by a low density of vias to a packaging substrate. One such case is a multi-tiered IC device in which the active layer 122 on the second die 12 contains memory circuitry. In such a case the active layer 114 on the first die 11 can be a microprocessor or other logic circuitry.

A further advantage is achieving better grounding through the vias due to the increased conductance of the larger diameter of the second set of vias. The larger diameter also allows for higher current densities through the vias reducing resistance. An additional result of the lower resistance is a reduction of heat generation by Joule heating. Lower heat generation levels allow denser circuitry to be fabricated. Finally, this structure retains the advantages of both via first processing and via last processing. Specifically, less surface area is reserved for the via on the active side of the substrate, allowing more circuitry to be built, and the substrate does not need to be reduced in thickness, leading to better performing transistors.

A further embodiment of this disclosure could stack the second die 12 on the first die 11 such that the interconnects 123 couple to the second set of vias 112.

Coupling as set forth in this document refers to any method available to transmit signals from one location to a second location either directly or indirectly. The signals are unaltered and unprocessed between coupling points. This can include electrical, optical, or other methods.

Figure 7:
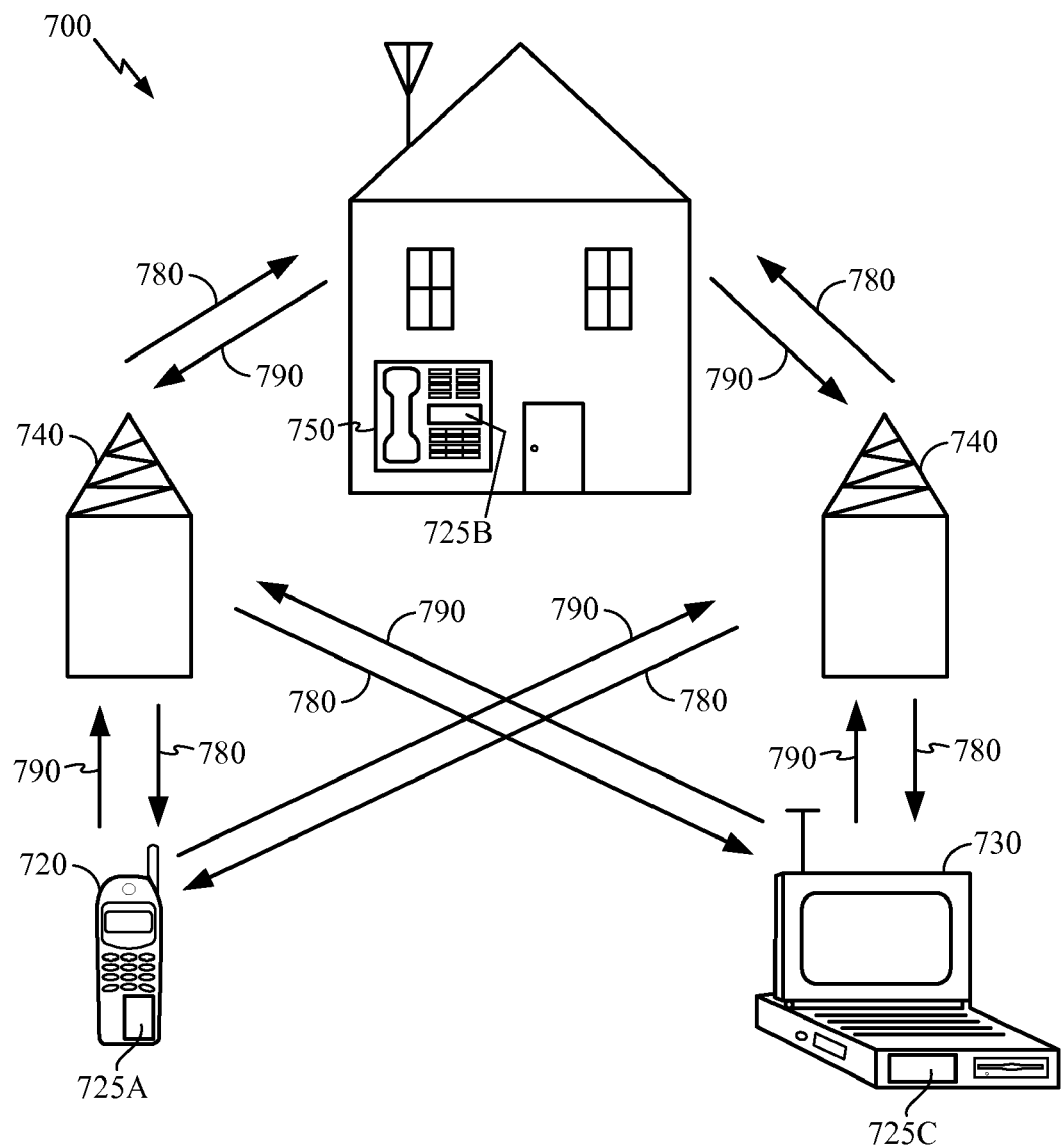
FIG. 7 shows an exemplary wireless communication system in which an embodiment of the invention may be advantageously employed.

FIG. 7 shows an exemplary wireless communication system 700 in which an embodiment of the invention may be advantageously employed. For purposes of illustration, FIG. 7 shows three remote units 720, 730, and 750 and two base stations 740. It will be recognized that typical wireless communication systems may have many more remote units and base stations. Remote units 720, 730, and 750 include multi-tiered IC devices 725A, 725B and 725C, created according to an embodiment of the invention. FIG. 7 shows forward link signals 780 from the base stations 740 and the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 7 illustrates remote units according to the teachings of the invention, the invention is not limited to these exemplary illustrated units. The invention may be suitably employed in any device which includes multi-tiered IC devices fabricated in accordance with the teachings of the disclosure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multi-tiered integrated circuit (IC) device, comprising:
a first die having a first set of vias and a second set of vias, the first set of vias extending into a substrate of the first die from a first side of the substrate, the second set of vias extending into the substrate from an opposite side of the substrate and coupling with the first set of vias, the first set of vias being manufactured prior to other circuitry of the die, the second set of vias being manufactured after other circuitry of the die is manufactured, in which the vias in the first set of vias are physically smaller than vias in the second set of vias.

2. The multi-tiered integrated circuit of claim 1, further comprising a second die having a set of interconnects, the second die stacked relative to the first die so the interconnects couple with the first set of vias on the first die.

3. The multi-tiered IC device of claim 1 in which the second set of vias have tapered walls.

4. The multi-tiered IC device of claim 1 in which
vias in the first set are 0.1-10 microns in diameter, and
vias in the second set are 11-100 microns in diameter.

5. The multi-tiered IC device of claim 1 in which at least one via in the second set of vias connects to a plurality of vias in the first set of vias.

6. The multi-tiered IC device of claim 1, further comprising a packaging substrate on which the first die is stacked, the second set of vias being coupled to the packaging substrate, and a least one of the vias from the first set of vias being coupled to the packaging substrate through the second set of vias.

7. The multi-tiered IC device of claim 1, in which the first die includes logic circuitry for a microprocessor.

8. The multi-tiered IC device of claim 7 in which the second die includes memory circuitry.

9. The multi-tiered IC device of claim 1 further comprising a third set of vias in a substrate of the second die, wherein at least one interconnect on the second die is coupled to at least one via in the third set of vias.

10. The multi-tiered IC device of claim 9 further comprising a variable number of dies containing interconnects stacked on the second die and coupled to at least one via of the third set of vias.

11. The multi-tiered IC device of claim 1, in which the multi-tiered IC device is integrated into a communications device.

12. The multi-tiered IC device of claim 1, in which the multi-tiered IC device is integrated into a personal computer.

* * * * *